United States Patent [19]

Chen

[11] Patent Number: 5,739,569
[45] Date of Patent: Apr. 14, 1998

[54] NON-VOLATILE MEMORY CELL WITH OXIDE AND NITRIDE TUNNELING LAYERS

[75] Inventor: Ih-Chin Chen, Richardson, Tex.

[73] Assignee: Texas Instruments Incorporated, Dallas, Tex.

[21] Appl. No.: 701,212

[22] Filed: Aug. 21, 1996

Related U.S. Application Data

[60] Continuation of Ser. No. 480,723, Jun. 7, 1995, abandoned, which is a division of Ser. No. 386,260, Feb. 9, 1995, which is a continuation of Ser. No. 994,050, Dec. 16, 1992, abandoned, which is a continuation of Ser. No. 701,431, May 15, 1991, abandoned.

[51] Int. Cl.$^6$ ............................................. H01L 29/788
[52] U.S. Cl. ................................. 257/321; 257/322
[58] Field of Search ................................. 257/321, 322

[56] References Cited

U.S. PATENT DOCUMENTS

| | | | |
|---|---|---|---|
| 3,984,822 | 10/1976 | Simko et al. | 340/173 |
| 4,219,829 | 8/1980 | Dorda et al. | 357/23 |
| 4,266,985 | 5/1981 | Ito et al. | 148/1.5 |
| 4,277,881 | 7/1981 | Godejahn, Jr. | 29/571 |
| 4,353,083 | 10/1982 | Trudel et al. | 357/23 |
| 4,403,307 | 9/1983 | Maeda | 365/174 |
| 4,467,452 | 8/1984 | Saito et al. | 365/184 |
| 4,485,552 | 12/1984 | Magdo et al. | 29/577 |
| 4,859,619 | 8/1989 | Wu et al. | 437/43 |
| 5,013,692 | 5/1991 | Ide et al. | 437/241 |
| 5,094,967 | 3/1992 | Shinada et al. | 437/43 |
| 5,138,410 | 8/1992 | Takebuchi | 357/23.5 |
| 5,268,319 | 12/1993 | Harari | 437/43 |

FOREIGN PATENT DOCUMENTS

| | | | |
|---|---|---|---|
| 0142252 | 5/1985 | European Pat. Off. | |
| 57-36868 | 2/1982 | Japan. | |
| 59-66171 | 4/1984 | Japan | 257/321 |
| 2-205361 | 8/1990 | Japan. | |
| 8605323 | 9/1986 | WIPO. | |

OTHER PUBLICATIONS

"Hot–Electron Emission From Silicon into Silicon Dioxide", T.H. Ning, *Solid State Electronics*, 1978, vol. 21, pp. 273–282.

"The Imact of Gate–Induced Drain Leakage Current on MOSFET Scaling", T.Y. Chan, J. Chen, P.K. Ko and C. Hu. 718–IEDM 87, CH2515–5/87/0000–0718, 1987 IEEE, pp. 718–721.

"Corner–Field Induced Drain Leakage in Thin Ozide MOSFETS", Chi Chang, Jih Lien 714–IEDM 87, CH2515–5/87/000–0714, 1987 IEEE, pp. 714–717.

"Leakage Mechanisms in the Trench Transistor DRAM Cell", Banerjee, et al. *IEEE Transactions on Elecctron Devices*, vol. ED–35, No. 1, Jan. 1988, pp. 108–116.

"A New Three–Terminal Tunnel Device", Banerjee, et al., *IEEE Electron Device Letters*, vol. EDL–8, No. 8, Aug. 1987, pp. 347–349.

"Emission Probability of Hot Electrons from Silicon into Silicon Dioxide", Ning, et al. *Journal of Applied Physics*, vol. 48, No. 1, Jan. 1977, pp. 286–293.

(List continued on next page.)

*Primary Examiner*—Jerome Jackson
*Attorney, Agent, or Firm*—Kay Houston; W. James Brady, III; Richard L. Donaldson

[57] ABSTRACT

A non-volatile memory cell structure capable of being programmed by band-to-band tunneling induced substrate hot electron injection is formed in a semiconductor substrate 8 and comprises first 10 and second 12 highly doped regions separated by a channel region 14. A nitride layer 16, such as silicon nitride for example, is formed over the channel region 14. An oxide layer 18, such as silicon dioxide, is then formed over nitride layer. The oxide/nitride layer serves as the floating gate insulator. In another embodiment, an additional oxide layer 15 may be formed between the channel region 14 and the nitride layer 16. The floating gate 20 is formed over the oxide layer 16 and a control gate 24 is insulatively formed over the floating gate 20. Other variations, advantages and a fabrication method are also disclosed.

20 Claims, 7 Drawing Sheets

OTHER PUBLICATIONS

"Fowler–Nordheim Tunneling into Thermally Grown SiO2", M. Lenzlinger et al., *Journal of Applied Physics*, vol. 40, No. 1, Jan. 1969, pp. 278–283.

"Determination of the Fowler–Nordheim Tunneling Barrier from Nitride to Oxide in Oxide: Nitride Dual Dielectric", Lwo D. Yau, *IEEE Electron Device Letters*, vol. EDL–7, No. 6, Jun. 1986, pp. 365–367.

"Effects of Barrier Aysmmetry on the Electrical Properties of Thin Oxide: Nitride Dielectrics", L. D. Yau et al., Intel Corporation, Portland Technology Developmetn, Aloha, Oregon, pp. 295–299.

NON-VOLATILE MEMORY CELL WITH OXIDE AND NITRIDE TUNNELING LAYERS

This is a continuation of Ser. No. 08/480,723 filed Jun. 7, 1995 now abandoned, which is a division of Ser. No. 08/386260 filed Feb. 9, 1995, which is a continuation of Ser. No. 07/994,050 filed Dec. 16, 1992 now abandoned, which is a continuation of Ser. No. 07/701,431 filed May 15, 1991 now abandoned.

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor devices and specifically to a non-volatile memory cell and a method for forming the same.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the programmable read-only memory which can be electrically programmed to store data. Some versions of these devices store data permanently; others, however, can be erased with ultraviolet light or an electrical current.

The construction of an EEPROM (electrically erasable programmable read-only memory) cell is similar to that of a field effect transistor, but additionally includes a floating gate between the gate conductor and the conduction channel of the transistor. During programming to store a desired logic state, electrons flowing in the conduction channel are attracted and trapped in the floating gate. This condition increases the threshold voltage of the transistor, thereby rendering it cutoff in response to normal read operation voltages. Hence, during reading of a transistor cell so programmed, the transistor will remain nonconductive and thus represent a high impedance between the source and drain. On the other hand, cells which have not been programmed will remain conductive in response to normal read operation voltages. In this manner, the memory can be programmed.

Common present non-volatile memory devices use channel hot electron or tunneling techniques to provide a stored charge on a floating gate to indicate a stored data bit. The most commonly used insulator to surround the floating gate is silicon dioxide. In one method, electrons tunnel through the silicon dioxide insulator barrier using Fowler-Nordheim tunneling. Another method used is channel hot electron injection. In channel hot electron injection, high velocity current is established between the source and drain. This high velocity current in turn induces impact ionization to provide free electrons having high energy. A certain percentage of these free electrons are drawn by the bias on the floating gate to cross the silicon dioxide barrier.

One limitation of Fowler Nordheim tunneling is the high field required across the insulator. This high field coupled with tunneling eventually destroys the integrity of the insulator layer and causes shorting between the floating gate and the substrate. Therefore, it is desirable to provide an electron injection mechanism operating at a lower electric field across the insulator between the substrate and the floating gate.

As for channel hot electron programming, the injection efficiency is typically below $10^{-6}$. Owing to this low efficiency, a high drained current must be applied to the device being programmed. This high current usually exceeds the capability of on-chip current capacitance and, thus requires an external power supply to provide the current. This requirement is considered a major inconvenience.

Accordingly, improvements which overcome any or all of the problems are presently desirable.

SUMMARY OF THE INVENTION

Other objects and advantages will be obvious, and will in part appear hereinafter and will be accomplished by the present invention which provides a non-volatile memory cell structure and a method for forming the same.

A non-volatile memory cell structure is formed in a semiconductor substrate and comprises first and second highly doped regions separated by a channel region. A nitride layer, such as silicon nitride for example, is formed over the channel region. An oxide layer, such as silicon dioxide, is then formed over nitride layer. The oxide/nitride layers serve as the floating gate insulator. In another embodiment, an additional oxide layer may be formed between the channel region and the nitride layer. The floating gate is formed over the oxide layer and a control gate is insulatively formed over the control gate.

The cell is programmed by band-to-band tunneling induced substrate hot electron injection (BBISHE). There are several advantages of using BBISHE as compared to channel hot electron (CHE) injection and Fowler-Nordheim tunneling. BBISHE injection has a very high injection efficiency compared to CHE injection. This property enables the memory cell to be programmed by a single five volt power supply. In addition, the oxide field during BBISHE injection is much smaller than in Fowler-Nordheim tunnelling. Because of this, the oxide reliability is greatly enhanced.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and method of the present invention. The preferred embodiment will be described first followed by a discussion of the advantages. Several variations and modifications will then be discussed. Finally, an illustrative method of fabrication will be discussed.

Figure 1:
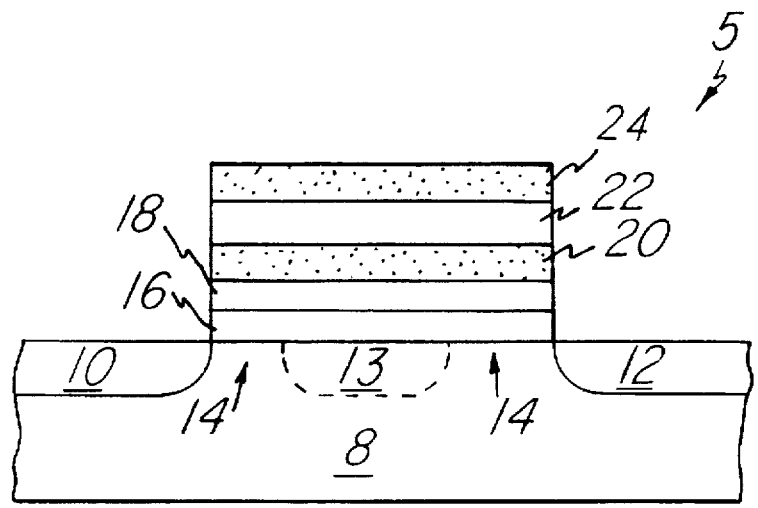
FIG. 1 is a cross-sectional view of a first embodiment cell.

Referring first to FIG. 1, a first embodiment of the present invention is shown. Semiconductor substrate 8 comprises heavily doped regions 10 and 12 which are separated by channel region 14. The substrate 8 typically comprises single crystal silicon. Heavily doped source and drain regions 10 and 12 are heavily doped either with N-type impurities for an N-channel device or with P-type impurities for a P-channel device. Doping concentrations are typically greater than $10^{19}$ cm$^{-3}$. Typically the channel region 14 is doped to between about $10^{16}$ cm$^{-3}$ and $10^{18}$ cm$^{-3}$ in the opposite polarity of source and drain regions 10 and 12. The high doping concentrations are used to enhance the BBISHE programming.

Also shown in FIG. 1 is optional highly doped region 13 which is formed in the surface of channel region 14. Region 13 has a conductivity type which is the same as the channel region 14 and typically has a doping concentration between about $8 \times 10^{17}$ and $2 \times 10^{18}$ cm$^{-3}$ and is typically at least one order of magnitude higher than the channel region. For example, channel region 14 may be doped to $10^{17}$ cm$^{-3}$ and highly doped region 13 to $10^{18}$ cm$^{-3}$. Region 13 is formed to enhance the BBISHE programming. If it is not included in the final structure, the doping concentration of the channel 14 is typically high—approximately $10^{17}$ cm$^{-3}$ for example.

Nitride layer 16 is formed above channel region 14. The nitride layer typically comprises silicon nitride ($Si_3N_4$) for example. The thickness of nitride layer 14 is typically in the range of between about 20 Å to 80 Å.

Formed above nitride layer 16 is an oxide layer 18, such as silicon dioxide for example. The thickness of oxide layer 18 is typically in the range of between about 50 Å and 100 Å.

Floating gate 20 is formed above oxide layer 18. Floating gate 20 may typically comprise heavily doped polysilicon for example. An insulating region 22 is formed above floating gate 20 and separates a control gate 24 from floating gate 20. Control gate 24 may also be typically comprised of polysilicon, whereas insulating layer 22 may also be silicon dioxide for example.

In use, heavily doped region 10 may serve as the source region for the cell and heavily doped region 12 as the drain. Of course, the source and drain may be reversed. Floating gate 20 will store the charge if the bit is programmed to a logic level "1", or will store no charge if it is stored to a logic level "0". Control gate 24 will act as the gate of the cell.

Figure 2:
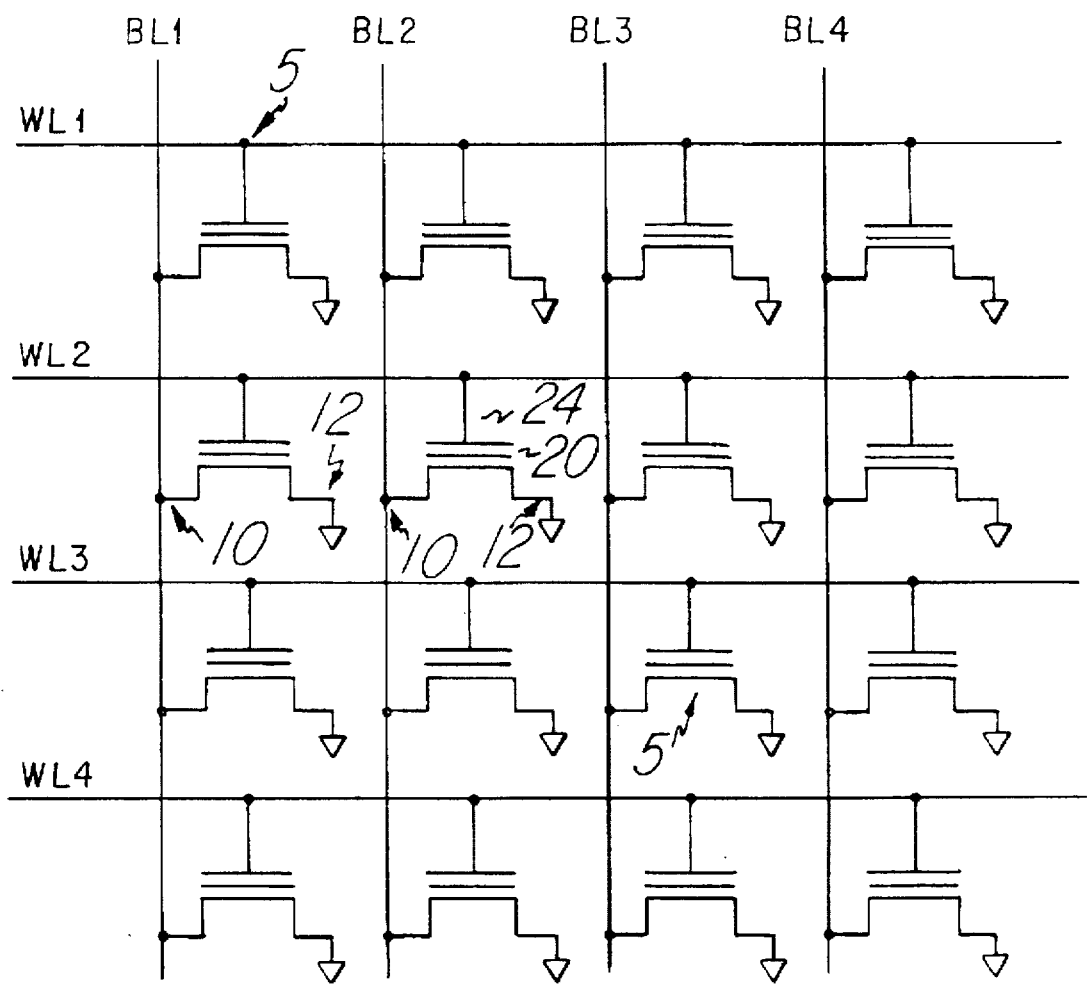
FIG. 2 is a schematic circuit diagram of an array cells.

The cell 5 may be one cell in an array of many like cells as shown in FIG. 2. Each cell is a floating gate transistor 5 having a source 10, a drain 12, a floating gate 20, and a control gate 24. All of the gates 24 in a row of cells are connected to a word line or row address line denoted here as WL1 through WL4. All word lines are typically connected to a row decoder (not shown). All of the source electrodes 10 in a column of cells are connected to a bit line or a column line denoted here as BL1 through BL4. All bit lines are typically connected to a column decoder (not shown). In the embodiment shown, all the drain regions 12 are connected to ground.

The non-volatile memory cell shown in FIG. 1 is programmed using band-to-band tunneling induced substrate hot electron injection and is erased using the Fowler-Nordheim mechanism.

The memory cell may be programmed by applying a positive voltage typically between 10 and 25 volts to the gate 24. In a preferred embodiment a gate voltage of 16 volts is used. The voltage may be supplied by a charge pump since only a very small gate current will exist. During programming a small voltage, between 0 and 8 volts for example, is applied to the source 10 and/or drain 12. In a preferred embodiment, 5 volts is applied to the source 10 and the drain 12 is grounded, ie. 0 volts.

A method of programming a floating gate memory device by band-to-band tunneling induced substrate hot electron injection (BBISHE) is disclosed in co-pending patent Ser. No. 589,719 (TI-13785A), incorporated herein by reference. In this application, the gate is brought up to the voltage sufficient to cause a heavily doped channel to invert. A positive voltage is applied to the source and drains of the transistor, thus causing the inverted electrons at the interface between the gate insulator and the substrate to be drawn away. This creates a deep depletion region, which causes band to band tunneling. With the removal of the inverted electrons, the band to band induced holes are driven away by the positive charge on the gate. These holes generate further electron hole pairs by impact ionization. A certain proportion of the cells will have energy sufficient to overcome the energy barrier provided by the insulator between the gate and the substrate. This energy, when coupled with the field on the gate, causes electrons to flow from the substrate into the gate. There is, however, a draw back with the BBISHE injection, as previously disclosed, when one wants to incorporate electrical erasability to the memory cell. This draw back is that the relatively thick ($\geq 150$ Å) oxide must be used. This thickness limitation, as imposed by the BBISHE injection for minimal write disturb, requires a relatively high voltage to erase the stored charges if Fowler Nordheim tunneling is to be used as the erasure mechanism.

With this draw back in mind, the ideal dielectric material for BBISHE programming and Fowler Nordheim erasure would have the following features:

1. A relatively low barrier height for BBISHE injection for electrons from the substrate to the gate.

2. An immunity from Fowler Nordheim injection from substrate to gate.

3. A high tendency for Fowler Nordheim injection from gate into substrate.

Figure 3A:
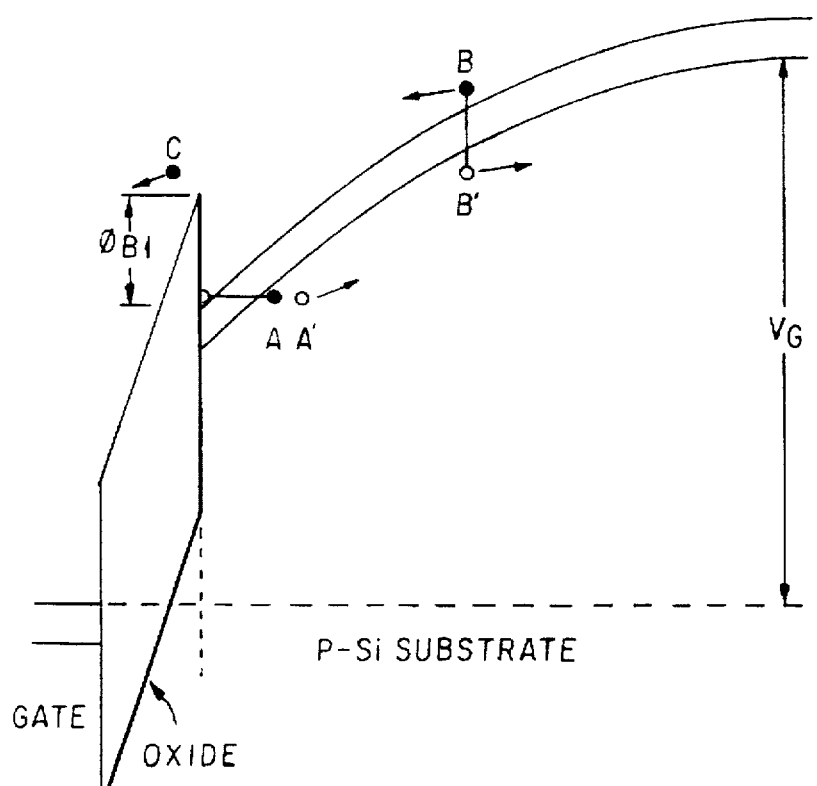
FIG. 3a–3b are band diagrams of the gate to substrate illustrating band-to-band tunneling for a cell built with an oxide and a nitride/oxide floating gate insulator.
Figure 3B:
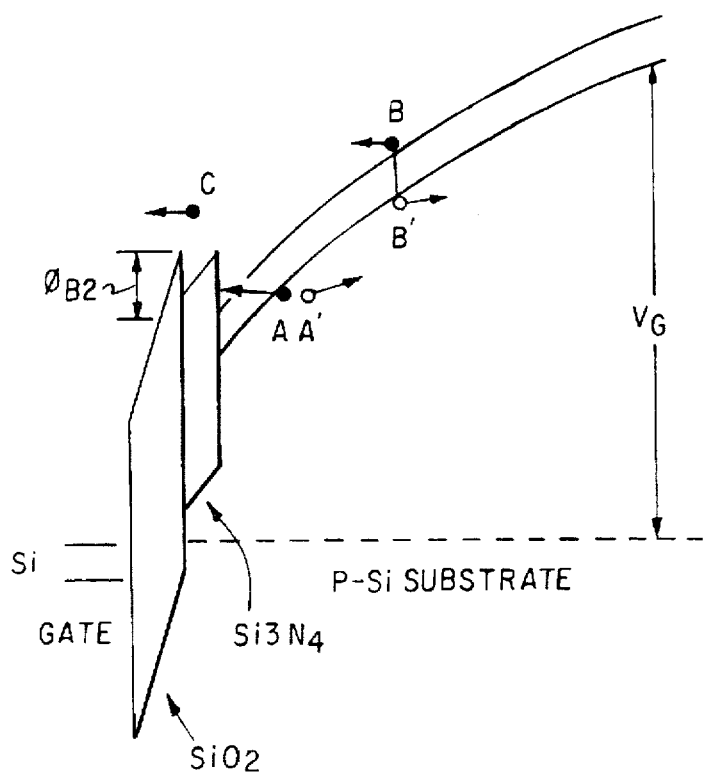

Unlike prior art gate insulating dielectrics, the stacked film of nitride 16 and oxide 18 (NO) shown in FIG. 1 meets these requirements. For example, the barrier height of conduction band of silicon to silicon nitride ($Si_3N_4$) is approximately two electron volts (eV), considerably lower than that of silicon dioxide ($SiO_2$) which has a barrier height of 3.2 eV. Since the probability of hot electron injection is roughly proportional to $e^{-\Phi B/E\lambda}$, where B is the barrier height, E is the electric field and $\lambda$ is the mean free path, the reduction of $\Phi_B$ from 3.2 eV for $SiO_2$ to 2 eV for $Si_3N_4$ greatly enhances the injection efficiency. FIGS. 3a and 3b compare the energy-band diagrams where the cases of oxide alone and oxide/nitride stacked film respectively. From these diagrams, one can readily appreciate the purpose of the nitride layer and the expected higher injection efficiency for the nitride case, since the barrier height $\Phi_{B2}$ shown in FIG. 3b is considerably lower than the barrier height $\Phi_{B1}$ shown in FIG. 3a.

Figure 4:
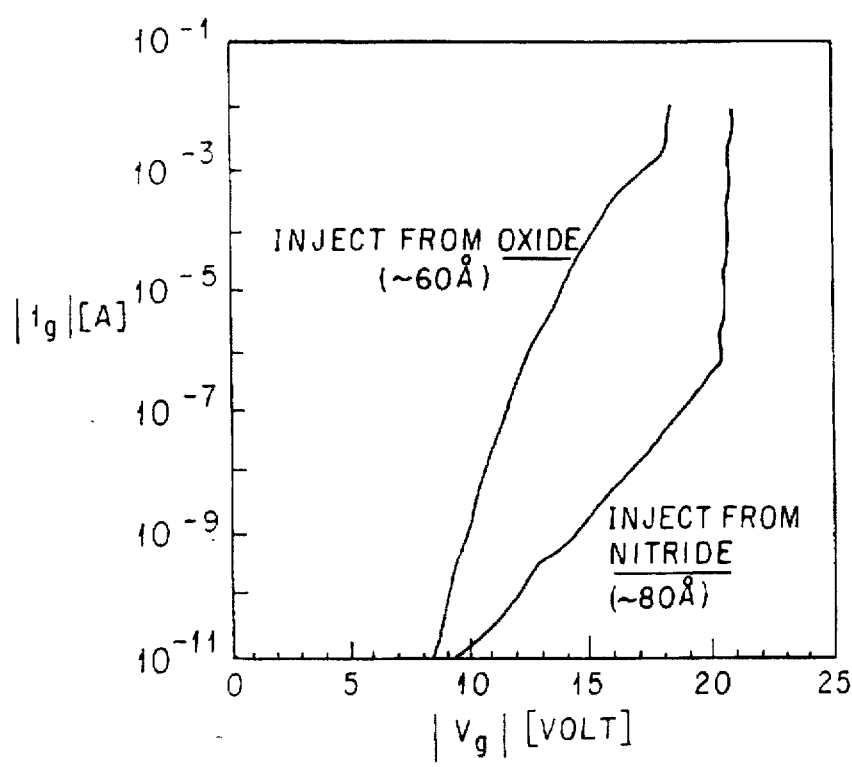
FIG. 4 is a graph showing the I-V characteristic of a nitride/oxide floating gate insulator device.

The other two requirements, namely asymmetry in the tunneling characteristics, can best be illustrated by FIG. 4. In this figure, the asymmetric tunneling characteristics of the nitride/oxide stacked film from either the nitride side or the oxide side are clearly shown. At a given gate voltage, for example 15 volts, tunneling from the oxide side is 4 to 5 orders of magnitude higher than that from the nitride side. This high asymmetry is very favorable in minimizing the write disturb during the BBISHE injection programming and also, in maximizing the tunneling erasure from the floating gate into the silicon substrate.

Figure 5:
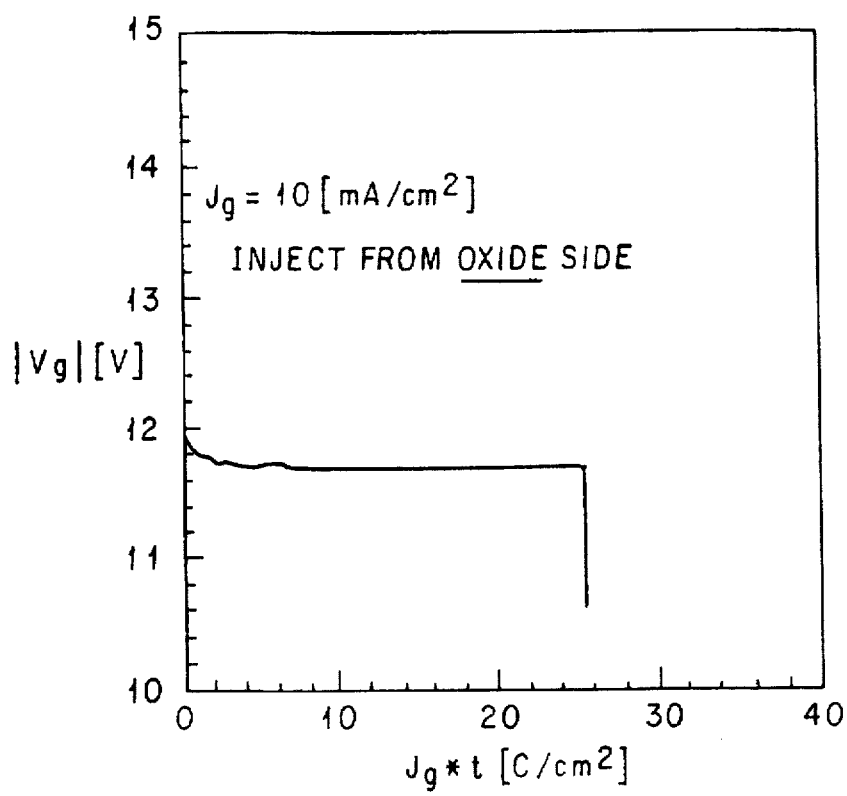
FIG. 5 is a graph illustrating the reliability of the nitride/oxide stacked film.

FIG. 5 shows the reliability of the nitride/oxide stacked film when a constant current density of 10 milliamps per centimeter squared passes from the oxide side. Two features are worth mentioning in this figure—charge trapping and charge to breakdown. Except for the initial slight decrease in gate voltage, indicating minor hole trapping in the film, the stacked film is essentially charge trapping free. In this example, dielectric breakdown occurs after passing about approximately 25 $c/cm^2$ of electrons through the film, which is high enough for EEPROM applications.

In some applications, for example, the one transistor flash EEPROM, the tunneling dielectric also serves as the gate dielectric of the conduction channel. For these cases, it is undesirable to have nitride layer 16 in direct contact with the channel 14 since the nitride/silicon interface is known to have a high density of interface traps, and thus a low channel mobility. For such cases, a thin oxide beneath the nitride/oxide stacked film can help restore channel mobility while keeping the same properties as described above.

Figure 6:
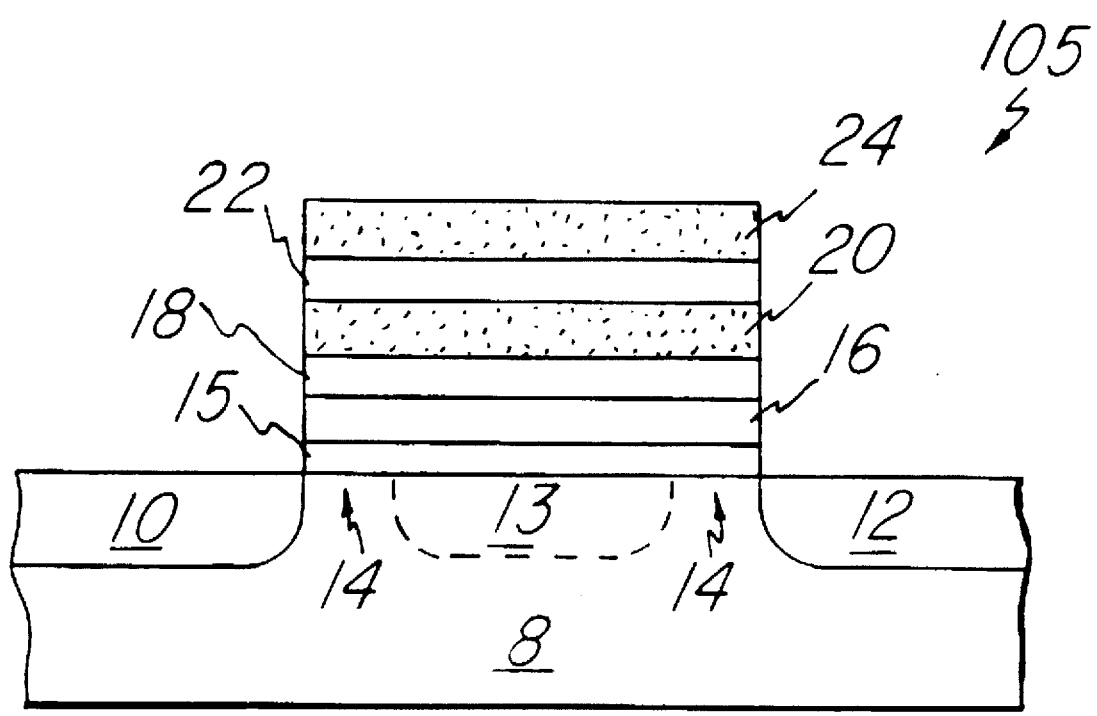
FIG. 6 is a cross-sectional view of an alternate embodiment cell.

Referring now to FIG. 6, a cell 105 which includes an oxide/nitride/oxide (ONO) film. The cell 105 shown in FIG. 6 is the same as cell 5 shown in FIG. 1 except for the addition of oxide layer 15 between nitride layer 16 and channel region 14. The oxide layer 15 may typically comprise silicon dioxide, for example, and be between about 20 Å to 30 Å thick.

Figure 7:
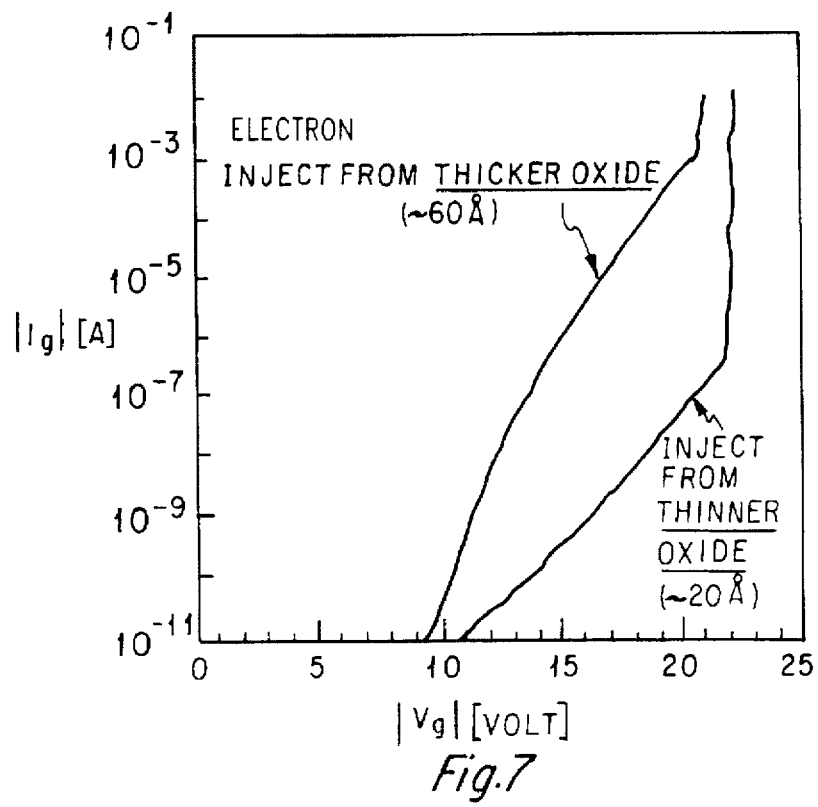
FIG. 7 is a graph showing the I-V characteristic of a oxide/nitride/oxide floating gate insulator device.

Referring now to FIG. 7, the I–V (current-voltage) characteristics of an ONO film with asymmetric oxide thicknesses is shown. In this example, the thickness of oxide layer 18 is about 60 Å, the thickness of oxide layer 15 is about 20 Å, and the nitride thickness is about 70 Å. Because electrons can direct tunnel across the 20 Å oxide layer 15 freely, the I–V curve shown in FIG. 7 is almost identical to that shown in FIG. 4.

Figure 8:
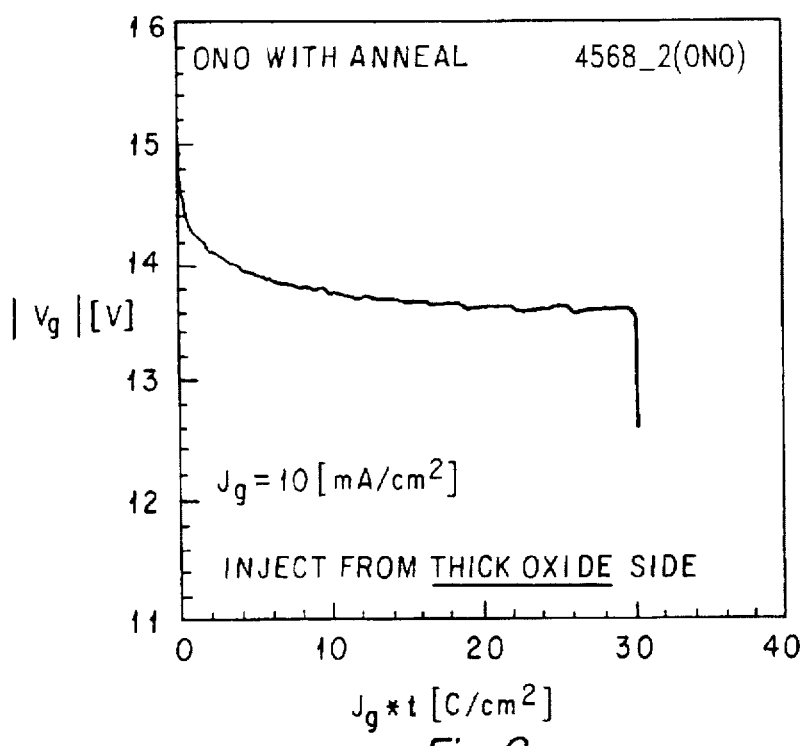
FIG. 8 is a graph illustrating the reliability of the oxide/nitride/oxide stacked

The graph shown in FIG. 8 for an ONO film is analogous to that shown in FIG. 5 for the NO film. The constant current stressing of the ONO dielectrics shown in FIG. 8 suggest that the composite film is somewhat more susceptible to hole trapping than the NO film shown in FIG. 5 but the charge to breakdown value, about 30 $c/cm^2$, is favorably higher for this example than that of the NO film shown in FIG. 5. Therefore, design trade-offs must be made when determining the desired stacked film configuration.

Figure 9:
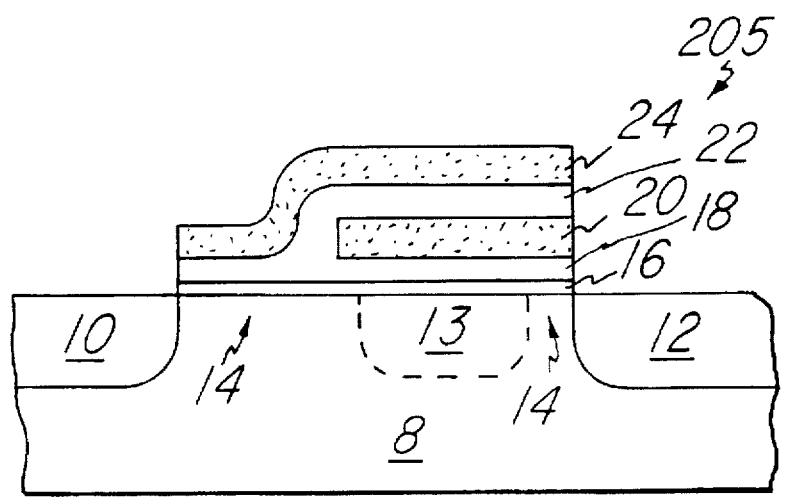
FIG. 9 is cross-sectional views of an alternate embodiment cell.

An alternate embodiment cell 205 is shown in FIG. 9. The cell 205 is a split-gate EEPROM. In the embodiment, the floating gate 20 extends over only a portion of channel region 14. Nitride layer 16 and oxide layer 18 comprise the gate insulation region and have properties as described above. A thin oxide layer, not shown, may also be included between nitride layer 16 and channel region 14. In addition, highly doped region 13 may be included as discussed above.

Figure 10A:
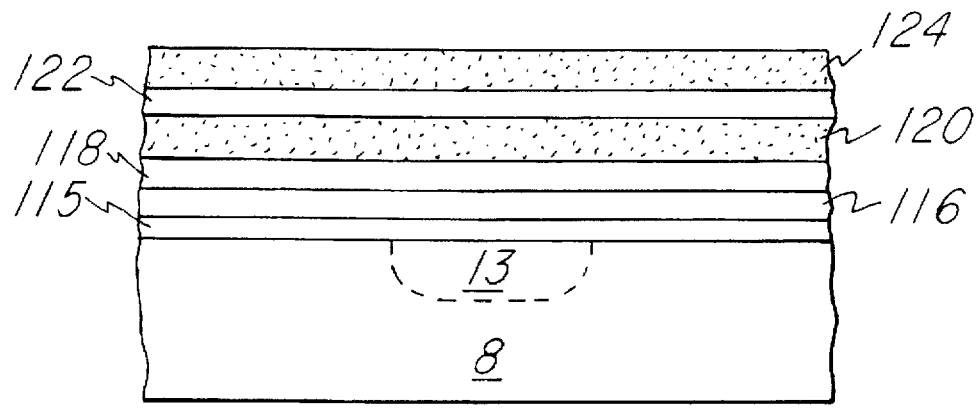
FIG. 10a–10c are cross-sectional views illustrating an illustrative method of fabricating the structure of the present invention.
Figure 10B:
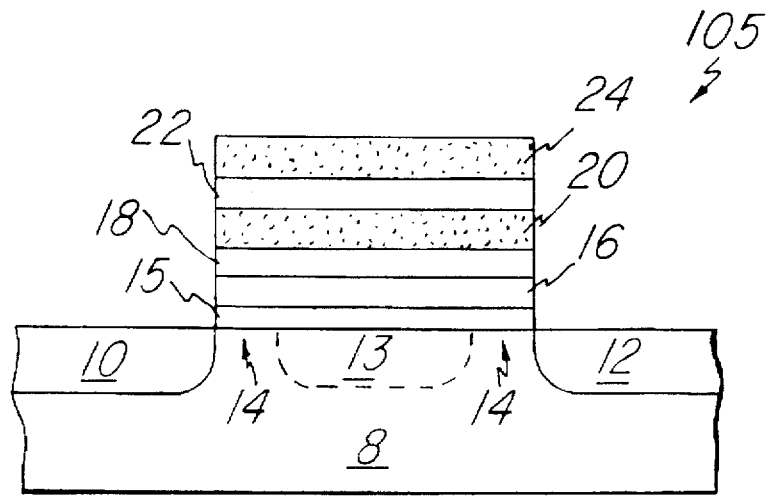
Figure 10C:
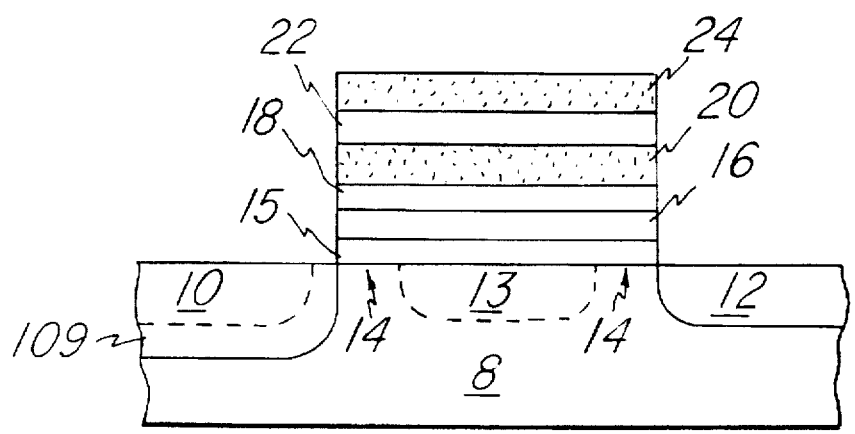

An illustrative process for fabricating the embodiment of the present invention is illustrated in FIGS. 10a–10c. Referring to FIG. 10a, oxide layer 115 is formed on the surface of substrate 8. One method of forming oxide layer 115 is to thermally grow an oxide, for example. Another method to form oxide layer 115 is to deposit silicon dioxide. As discussed above, the inclusion of oxide layer 115 is optional and as such layer 115 may be left out.

The surface of substrate 8 may be doped to a given doping concentration prior to forming the oxide layer 115. In addition, if highly doped region 13 is to be included, it is formed prior to forming layer 115. Doping techniques such as diffusion and ion implantation are well known in the art and may be used here.

Next, nitride layer 116 is formed on the oxide layer 115 (or substrate 8 if oxide layer 115 is not included). Nitride layer 116 may be formed by depositing silicon nitride, for example. Oxide layer 118 is then formed over nitride layer 116. Oxide layer 118 may be formed by depositing silicon dioxide for example.

Conductive layer 120, which will become the floating gate, is then formed. For example, forming conductive layer 120 may be formed by depositing and doping, or in situ depositing, polysilicon.

Next, an insulating layer 122 is formed over conductive layer 120. Layer 122 may comprise multiple layers. Although not shown in FIG. 10a, for example, layer 122 may comprise an oxide layer formed beneath a nitride layer. The nitride layer is used in this case to control the thickness of layer because later oxidations will be blocked in this region by the nitride. In another embodiment, insulating layer 122 may comprise deposited silicon dioxide only.

Conductive layer 124 is formed above insulating layer 122 and may also be formed by depositing and doping, or in situ depositing, polysilicon.

Referring now to FIG. 10b, a portion of the surface of substrate 8 is exposed by etching the previously formed layers 115, 116, 118, 120, 122 and 124. The layers are etched using photolithography techniques which are currently known in the art. Highly doped regions 10 and 12 are formed to serve as the source and drain. Regions 10 and 12 may doped by ion implantation or diffusion, as examples.

The techniques which may be used for deposition, doping and etching are well known in the current art and are strictly by design choice.

A variation of the preferred embodiment is shown in FIG. 10c. Here a deep graded junction has been formed in the source region 10. One method to form a deep graded junction is to dope the region 10 with both arsenic and phosphorus and dope the region 12 with arsenic only followed by a high temperature bake. The phosphorus will diffuse into the substrate and beneath the floating gate, forming region 10a, to a greater extent than the arsenic, thereby creating the desired junction.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non-volatile memory cell structure, comprising:
   a semiconductor substrate comprising a first region, a second region and a channel region, said first and second regions highly doped to a first conductivity type, wherein said channel region separates said first and second regions, wherein said channel region is doped to a second conductivity type, said second conductivity type being different than said first conductivity type;
   a nitride layer formed over said channel region;
   an oxide layer formed over said nitride layer, said oxide layer being between 80 and 100 angstroms thick;
   a floating gate formed over said oxide layer, wherein at least a portion of said channel region underlies said floating gate;
   an insulating layer formed over said floating gate; and
   a control gate formed over said insulating layer.

2. The structure of claim 1 and further comprising a third highly doped region of said second conductivity type formed in said channel region.

3. The structure of claim 1, wherein said oxide comprises silicon dioxide.

4. The structure of claim 1, wherein said nitride comprises silicon nitride.

5. The structure of claim 1, wherein said nitride layer is between 20 and 80 angstroms thick.

6. The structure of claim 1, and further comprising a second oxide layer formed between said channel region and said nitride layer.

7. The structure of claim 6, wherein said second oxide layer is between 20 and 30 angstroms thick.

8. The structure of claim 1, wherein said floating gate and said control gate comprise polysilicon.

9. The structure of claim 1, wherein said memory cell is one cell in an array of like cells.

10. A non-volatile memory cell structure, comprising:
    a semiconductor substrate comprising a first region, a second region and a channel region, said first and second regions highly doped to a first conductivity type, wherein said channel region separates said first and second regions, wherein said channel region is doped to a second conductivity type, said second conductivity type being different than said first conductivity type, wherein said channel region is doped to between $10^{16}$ cm$^{-3}$ and $10^{18}$ cm$^{-3}$;
    a nitride layer formed over said channel region, said nitride layer being between 20 and 80 angstroms thick;
    an oxide layer formed over said nitride layer, said oxide layer being between 80 and 100 angstroms thick;
    a floating gate formed over said oxide layer, wherein at least a portion of said channel region underlies said floating gate;
    an insulating layer formed over said floating gate; and
    a control gate formed over said insulating layer.

11. The structure of claim 10 and further comprising a third highly doped region of said second conductivity type formed in said channel region.

12. The structure of claim 10, wherein said oxide comprises silicon dioxide.

13. The structure of claim 10, wherein said nitride comprises silicon nitride.

14. The structure of claim 10, and further comprising a second oxide layer formed between said channel region and said nitride layer.

15. The structure of claim 10, wherein said floating gate and said control gate comprise polysilicon.

16. The structure of claim 10, wherein said memory cell is one cell in an array of like cells.

17. The structure of claim 2, wherein said third highly doped region is doped to between $8 \times 10^{17}$ cm$^{-3}$ and $2 \times 10^{18}$ cm$^{-3}$.

18. The structure of claim 11, wherein said third highly doped region is doped to between $8 \times 10^{17}$ cm$^{-3}$ and $2 \times 10^{18}$ cm$^{-3}$.

19. A non-volatile memory cell structure, comprising:
    a semiconductor substrate comprising a first region, a second region and a channel region, said first and second regions highly doped to a first conductivity type, wherein said channel region separates said first and second regions, wherein said channel region is doped to a second conductivity type, said second conductivity type being different than said first conductivity type, wherein said channel region is doped to between $10^{16}$ cm$^{-3}$ and $10^{18}$ cm$^{-3}$, said channel region comprising a top surface, wherein said channel region comprises a third highly doped region of said second conductivity type near said top surface;
    a nitride layer formed over said channel region, said nitride layer being between 20 and 80 angstroms thick;
    an oxide layer formed over said nitride layer, said oxide layer being between 80 and 100 angstroms thick;
    a floating gate formed over said oxide layer, wherein at least a portion of said channel region underlies said floating gate;
    an insulating layer formed over said floating gate; and
    a control gate formed over said insulating layer.

20. The structure of claim 19, wherein said third highly doped region is doped to between $8 \times 10^{17}$ cm$^{-3}$ and $2 \times 10^{18}$ cm$^{-3}$.

* * * * *